United States Patent
Yamaoka (10) Patent No.: US 8,159,209 B2
(45) Date of Patent: Apr. 17, 2012

(54) DIGITAL SIGNAL DELAY MEASURING CIRCUIT AND DIGITAL SIGNAL DELAY MEASURING METHOD

(75) Inventor: Kensuke Yamaoka, Shinjuku-ku (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 308 days.

(21) Appl. No.: 12/466,832

(22) Filed: May 15, 2009

(65) Prior Publication Data
US 2009/0284247 A1    Nov. 19, 2009

(30) Foreign Application Priority Data
May 16, 2008  (JP) .................. 2008-130151

(51) Int. Cl.
*G01R 23/175* (2006.01)
(52) U.S. Cl. ............. 324/76.54; 324/754.19; 324/76.35; 324/617
(58) Field of Classification Search ............... 324/76.54, 324/754.19, 76.35, 617
See application file for complete search history.

(56) References Cited

U.S. PATENT DOCUMENTS

| | | | | |
|---|---|---|---|---|
| 5,097,208 A * | 3/1992 | Chiang | .................. | 324/537 |
| 5,534,805 A * | 7/1996 | Miyazaki et al. | ............. | 327/144 |
| 6,693,449 B1 * | 2/2004 | Gorgen | .................. | 324/750.3 |
| 6,927,580 B2 * | 8/2005 | Wuidart et al. | ............. | 324/617 |
| 7,308,625 B1 * | 12/2007 | Wingen et al. | ............. | 714/724 |
| 7,400,160 B2 * | 7/2008 | Hokoiwa et al. | ........... | 324/750.3 |
| 2010/0277158 A1 * | 11/2010 | Lee et al. | .................. | 324/76.79 |

FOREIGN PATENT DOCUMENTS
JP    2004-146612 A    5/2004

* cited by examiner

*Primary Examiner* — Richard Isla Rodas
(74) *Attorney, Agent, or Firm* — Sughrue Mion, PLLC

(57) ABSTRACT

A digital signal delay measuring circuit for measuring a delay time of a digital signal of a scan-testable digital circuit inside a device to be tested is provided. The circuit includes: outputting means for outputting a delay time measuring signal as a digital signal; delay means for delaying a timing when a state of the delay time measuring signal is changed; and at least two signal holding means, each receiving the delay time measuring signal and holding the state of the delay time measuring signal at a holding-command input timing.

4 Claims, 10 Drawing Sheets

DIGITAL SIGNAL DELAY MEASURING CIRCUIT AND DIGITAL SIGNAL DELAY MEASURING METHOD

BACKGROUND OF THE INVENTION

1. Field of the Invention

The present invention relates to a technical field of a digital signal delay measuring circuit for measuring a delay time of a digital signal in a digital circuit.

2. Description of the Related Art

In recent years, a digital circuit inside an IC (Integrated Circuit) has an outstanding tendency toward an operation speed-up and a large circuit scale due to fine patterning. However, the speed-up may cause a severer problem of fluctuation in delay time resulting from manufacturing process, which becomes a serious problem in IC mass production. Therefore, in the manufacturing test of a high-speed operating IC, delay fault diagnosis that is one scan test is carried out to determine a defective product.

As one of the delay fault diagnosis methods, there is often performed a real-time scan test (At-Speed Test). This method is such that a shift operation of scanned data is performed with a low-speed scan clock that is used in a usual scan test and an actual circuit operation test is performed with a user clock inside the IC.

Figure 1:
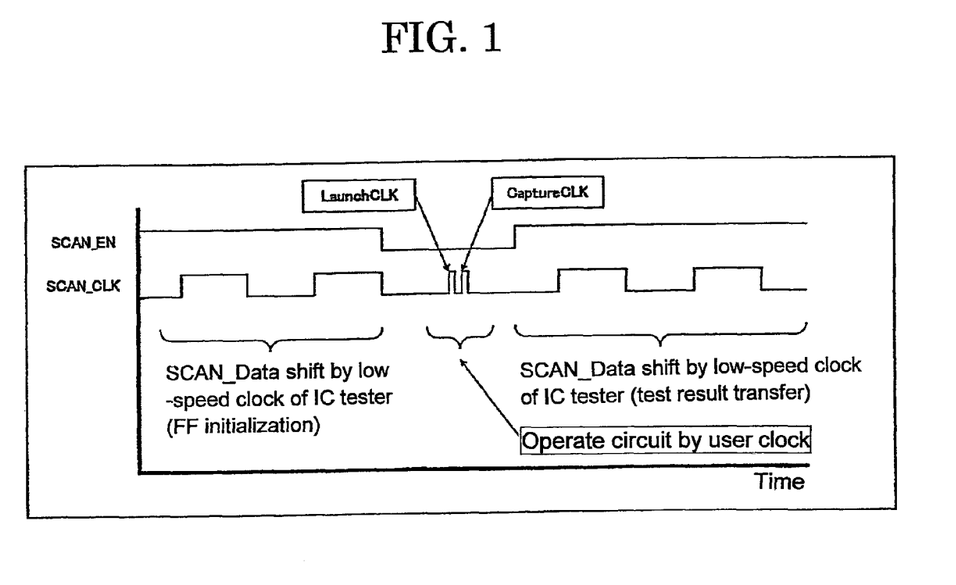
FIG. 1 is a view showing a real-time scan test.

FIG. 1 shows the real-time scan test. The two cycle clocks, LaunchCLK and CaptureCLK, in FIG. 1 are the user clock used actually, and generally, they show higher speed than that of the shift clock output from an IC tester for example. The delay fault diagnosis is performed with the use of these LaunchCLK and CaptureCLK by operating the circuit with the actually-used user clock.

Meanwhile, as the IC manufacturing test needs to take shorter time, more circuits than those used practically are to operate simultaneously. As a result, more current than that of practical use is made to pass through the IC, and there occurs a large IR-Drop (supply voltage drop).

As the IR-Drop increases a delay time of each element, the delay fault diagnosis sometimes results in error. The IR-Drop is broadly divided into a static IR-Drop and a dynamic IR-Drop. The static IR-Drop is a phenomenon where the supply voltage drops even when the circuit is out of operation. On the other hand, the dynamic IR-Drop is a phenomenon where the supply voltage drops by the circuit operating actually. In the former, measurement of the delay time is easy because the delay time can be measured while the IC operation is stopped. However, in the latter, measurement per se is difficult. Particularly in the case of a large-scale synchronous circuit, many circuits operate simultaneously with change in clock, and therefore, the dynamic IR-Drop in the large-scale synchronous circuit becomes a voltage drop phenomenon occurring in an extremely short time with clock change.

Figure 2:
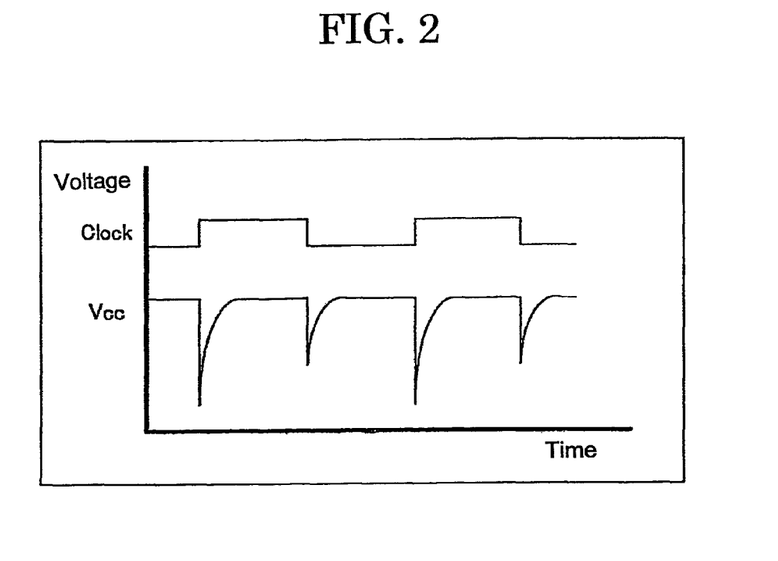
FIG. 2 is a view of an image of the dynamic IR-Drop.

FIG. 2 shows the dynamic IR-Drop image. As shown in FIG. 2, the dynamic IR-Drop is a supply voltage drop phenomenon that occurs in an extremely short time. This phenomenon depends on the number of circuits that are under operation. It also depends on the current supply capacity of the supply circuit. Hence, the dynamic IR-Drop varies depending on the physical position inside the IC. Further, the dynamic IR-Drop depends on the operation states of circuits (activation rate of the circuits) even when they are at the same position. Therefore, measurement is difficult for the dynamic IR-Drop.

A synchronous circuit operates depending on clock change. Therefore, it is greatly susceptible to the dynamic IR-Drop and results in larger delay time. Specifically, for recent large-scale synchronous circuits, simultaneously-operating circuits are increased in scale with increase in influence of the dynamic IR-Drop, which causes a bottleneck for the delay fault diagnosis. In other words, when the influence on the circuit delay by the dynamic IR-Drop is large, the delay fault diagnosis highly probably results in error. Specifically, in the scan test of the large-scale synchronous circuits, the scale of circuits operating simultaneously becomes larger. This tends to enlarge the delay due to the dynamic IR-Drop and to increase the possibility of diagnosis error.

Conventionally, as the method for measuring an increase of delay time due to IR-Drop, there has been widely performed measurement with a ring oscillator disclosed, for example, in Patent Document No. 1. Patent Document No. 1: Japanese Patent Application Laid-Open No. 2004-146612

SUMMARY OF THE INVENTION

However, as the method for measuring a delay time with the ring oscillator is performed based on a frequency fluctuation by the ring oscillator, this method needs to count the frequency and takes much more time, problematically. Hence, this method is difficult for measurement of the circuit delay due to the dynamic IR-Drop.

In addition, a variation in IC delay time is an inevitable problem depending on the manufacturing process. Hence, for some products, they need to be sorted (demarcated with rank) depending on the IC normal operation speed. In such a case, there is a need to determine the IC normal operation speed. However, conventionally, there is no way to determine the IC operation speed objectively and the IC operation speed is often determined based on experience. This presents a conventional problem that they have to be demarcated with rank with more margin than necessary.

The present invention has been made in view of the above-mentioned problems and the like, and has an object to provide a digital signal delay measuring circuit and a digital signal delay measuring method capable of measuring a delay time of a digital circuit instantaneously and measuring a true delay time with influence of the dynamic IR-Drop taken into consideration at a low cost.

In order to solve the above problems, the invention according to an exemplary non-limiting embodiment relates to a digital signal delay measuring circuit for measuring a delay time of a digital signal of a scan-testable digital circuit inside a device to be tested, comprising:

outputting means for outputting a delay time measuring signal as a digital signal;

delay means for delaying a timing when a state of the delay time measuring signal is changed; and at least two signal holding means, each receiving the delay time measuring signal, and holding the state of the delay time measuring signal at a holding-command input timing, wherein the holding-command input timing is identical between the at least two signal holding means, and the timing when the state of the delay time measuring signal input to each of the signal holding means is changed is different depending on the delay means, and the delay time is obtained based on a difference in the state of the delay time measuring signal held by each of the signal holding means.

According to an aspect of the digital signal delay measuring circuit, each of the signal holding means receives, as the holding command, a user clock generated by clock generating means for generating the user clock in a real-time scan test, the user clock having a pulse width actually used in the digital circuit.

According to an aspect, the delay means is disposed in each of signal transmission paths between an output unit of the delay time measuring signal of the outputting means and a delay time measuring signal input unit of each of the signal holding means, and the numbers of the delay means disposed in the signal transmission paths are different from each other.

The digital signal delay measuring circuit may further include a delay adjusting means for delaying the delay time measuring signal before the delay time measuring signal is delayed by the delay means in such a manner that the state of the delay time measuring signal in each of the signal transmission paths is sequentially changed by the delay means within a given range having the holding-command input timing as a reference.

The invention according to another exemplary non-limiting embodiment relates to a delay time measuring method of measuring a delay time of a digital signal of a scan-testable digital circuit inside a device to be tested by using a digital signal delay measuring circuit having:

outputting means for outputting a delay time measuring signal as a digital signal;

delay means for delaying a timing when a state of the delay time measuring signal is changed; and at least two signal holding means each for receiving the delay time measuring signal and holding the state of the delay time measuring signal at a holding-command input timing, the holding-command input timing being adjusted to be identical between the at least two signal holding means, and the timing when the state of the delay time measuring signal input to each of the signal holding means is changed being adjusted to be different depending on the delay means, the delay time measuring method comprising the processes of:

outputting a signal showing the state of the delay time measuring signal held by each of the signal holding means based on the holding-command input; and measuring the delay time based on a difference in the state shown by the signal output from each of the signal holding means.

According to the present invention, the timing when the state of the delay time measuring signal output from the outputting means is changed is delayed by each delay means, the state of the delayed delay time measuring signal is held by each signal holding means when a holding command is input, and a delay time is calculated based on a difference in state of the delay time measuring signals held by the respective signal holding means. This structure makes it possible to measure the delay time of the digital circuit instantaneously, to measure, at low cost, a true delay time with the influence of the dynamic IR-Drop taken into consideration and to study the delay fault in more detail.

DESCRIPTION OF THE PREFERRED EMBODIMENTS

With reference to the drawings, a preferred embodiment of the present invention will be described in detail below.

First description will be made, with reference to FIG. 3, about the principle of a digital signal delay measuring circuit according to the present invention.

Figure 3:
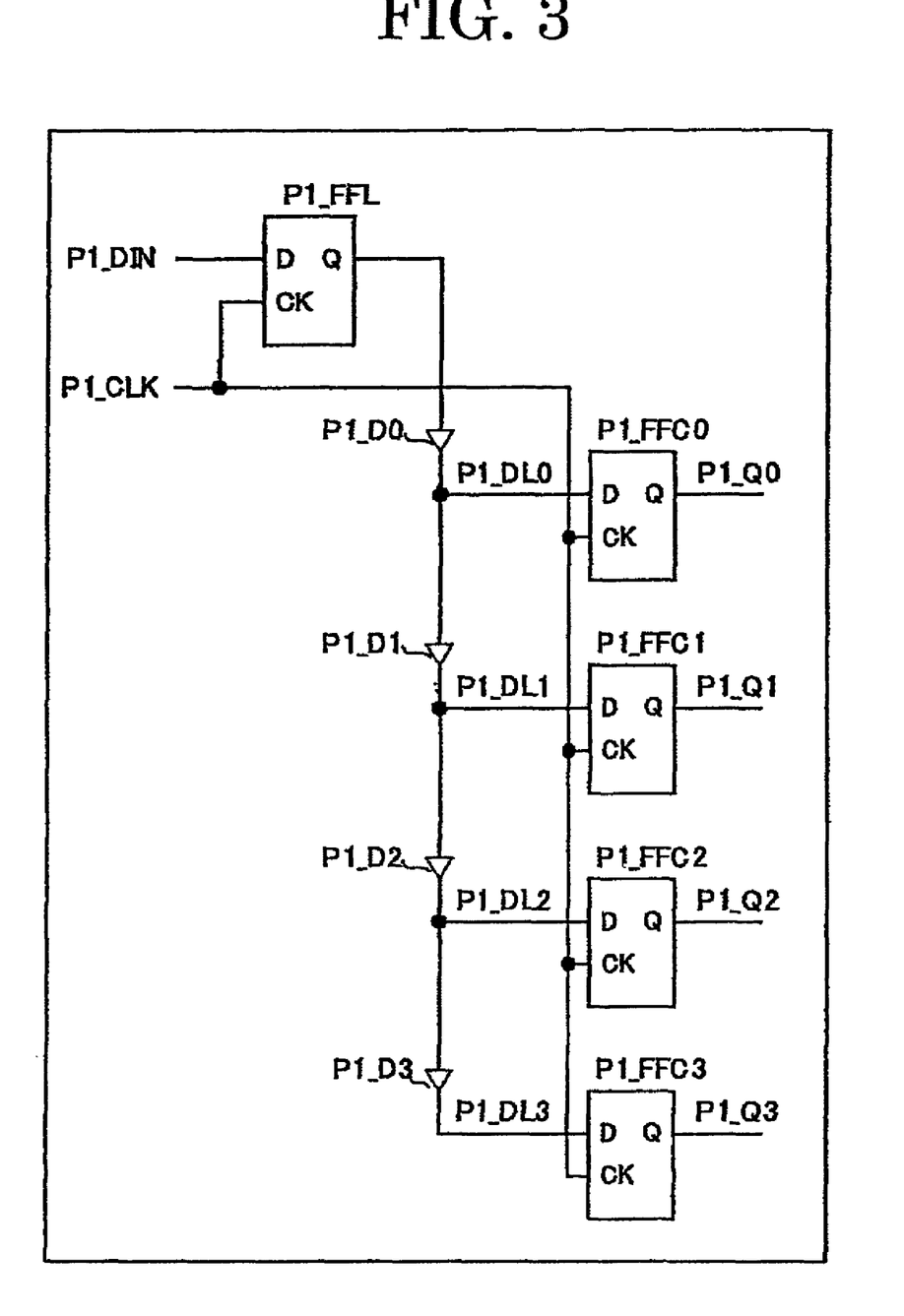
FIG. 3 is a view illustrating an example of a digital signal delay measuring circuit according to an embodiment of the present invention.

FIG. 3 illustrates an example of the digital signal delay measuring circuit according to one embodiment of the present invention and is the principle view in which the scan line circuit is omitted. This digital signal delay measuring circuit is implemented in a device to be tested (e.g., LSI) for measuring a delay time of a digital signal for a scan-testable digital circuit inside the device to be tested.

In the example of FIG. 3, the digital signal delay measuring circuit is configured to have: an activation flip-flop P1_FFL as one example of outputting means for outputting a delay time measuring signal as digital signal (output from "Q" in FIG. 3); reception flip-flops P1_FFC0, P1_FFC1, P1_FFC2 and P1_FFC3 as one example of signal holding means for receiving the delay time measuring signal (input via "D" in FIG. 3) and holding a state of the delay time measuring signal at the timing when a clock signal is input as one example of a holding command; and delay elements P1_D0, P1_D1, P1_D2, P1_D3 as one example of delay means for delaying the timing when the state of the delay time measuring signal is changed (the delay time of the delay time measuring signal by each delay element is almost the same).

Here, the timings when clock signals (P1_CLK signals) are input from a clock signal line P1_CLK to the activation flip-flop PL_FFL and the reception flip-flops PL_FFC0, P1_FFC1, P1_FFC2 and P1_FFC3 (input via "CK" in FIG. 3) (for example, the timing when the clock is set to the High level) are almost the same.

In addition, between an output part of the delay time measuring signal of the activation flip-flop P1_FFL ("Q" in the figure) and input parts of the delay time measuring signal of each of the reception flip-flops PL_FFC0, P1_FFC1, P1_FFC2 and P1_FFC3 ("D" in the figure), there is a signal transmission path (signal line) in which the delay element exists (at least one of P1_D0, P1_D1, P1_D2, P1_D3). The number of delay elements existing in signal transmission paths is different from each other as shown in the figure (for example, in the signal transmission path between the flip-flop P1_FFL and the flip-flop P1_FFC1, there are two delay elements PL_D0 and P1_D1 interposed). With this structure, the timing when the state (High or Low level) of the delay time measuring signal input to each of the reception flip-flops PL_FFC0, P1_FFC1, P1_FFC2 and P1_FFC3 is changed is different from each other, depending on the delay elements PL_D0, P1_D1, P1_D2, P1_D3.

With such a circuit structure, the delay time measuring signal output from the activation flip-flop P1_FFL is delayed by a delay time of each of the delay elements PL_D0, P1_D1, P1_D2 and P1_D3 to be input to (reach) the corresponding reception flip-flop PL_FFC0, P1_FFC1, P1_FFC2 or P1_FFC3. Then, the time period of the P1_CLK signal and the delay time of each of the delay elements PL_D0, P1_D1, P1_D2 and P1_D3 are adjusted appropriately thereby to determine whether or not each flip-flop can correctly hold and transfer the output data showing the state (High or Low) of the delay time measuring signal output from the flip-flop P1_FFL. When it is determined which flip-flop can transfer the data correctly, the delay time of the digital signal can be measured. In other words, a difference in the states of the delay time measuring signals held in the flip-flops PL_FFC0, P1_FFC1, P1_FFC2 and P1_FFC3 can be used as a basis to obtain the delay time.

Next, a more concrete example of the digital signal delay measuring circuit of this invention will be explained with reference to FIGS. 4 to 6.

Figure 4:
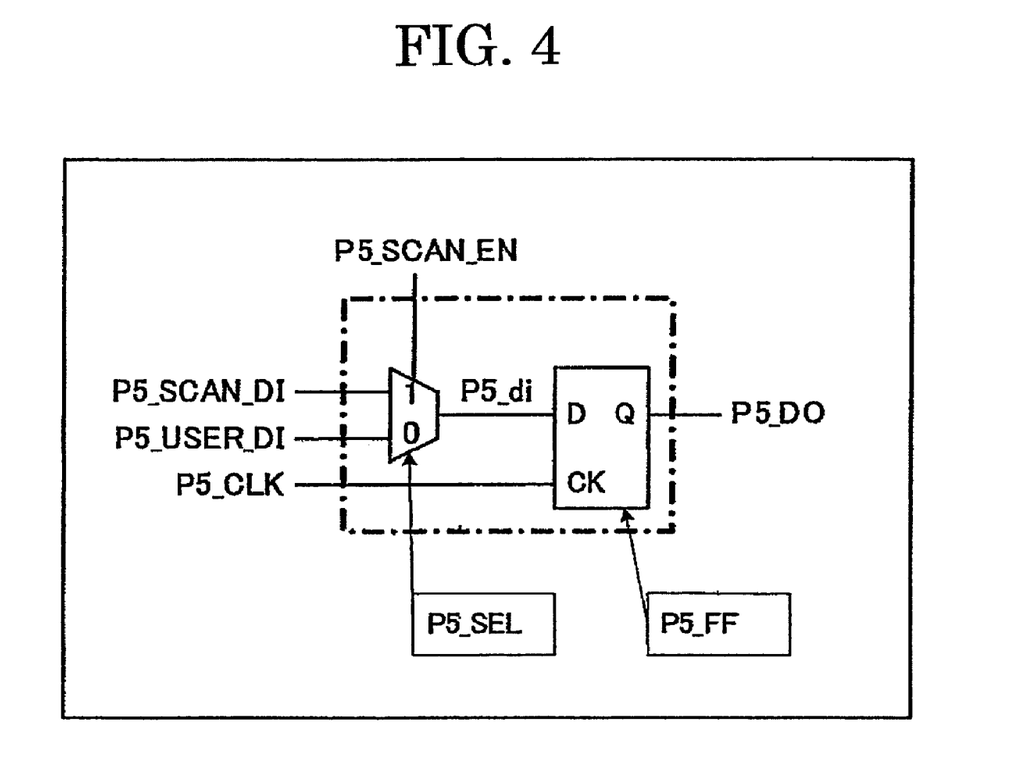
FIG. 4 is a view illustrating a structural example of a general scannable flip-flop.

FIG. 4 is a view showing a structural example of a standard scannable flip-flop. Here, the flip-flop P5_FF shown in FIG. 4 is a D type flip-flop. In FIG. 4, the selector element P5_SEL has a function of connecting a P5_SCAN_DI signal line to a P5_di signal line when a PS_SCAN_EN signal in a P5_SCAN_EN signal line is at the High level and connecting a P5_USER DI signal line to the P5_di signal line when the P5_SCAN_EN signal is at the Low level.

Figure 5:
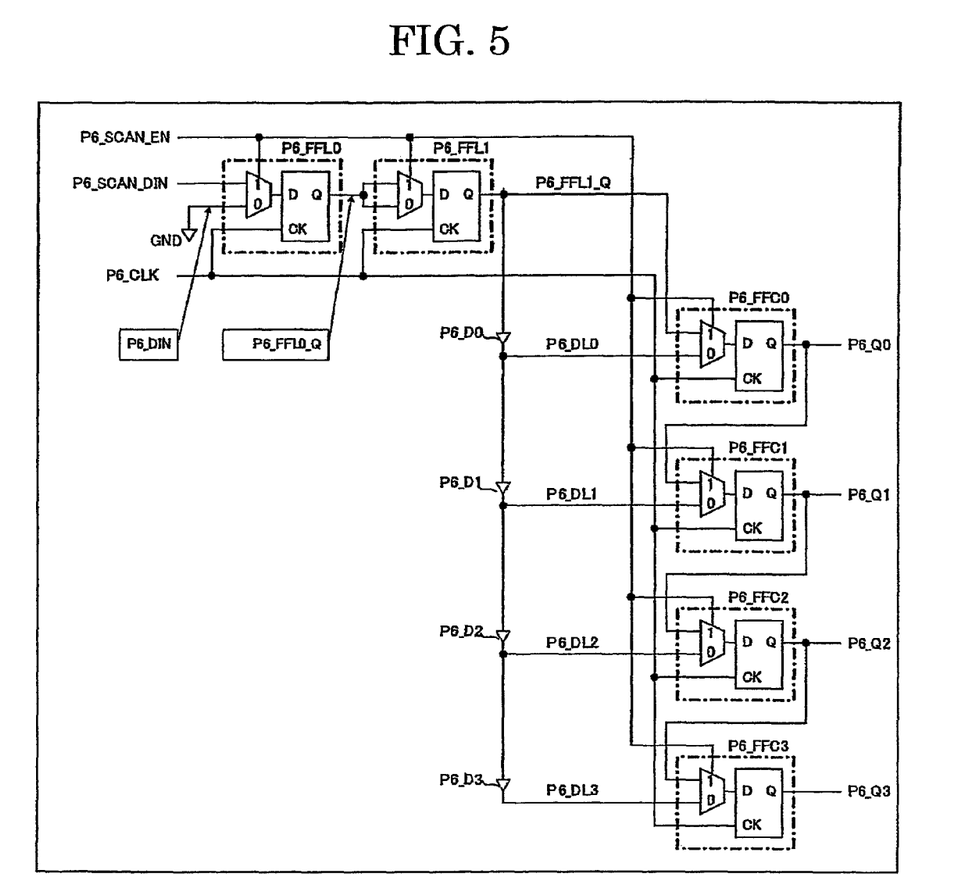
FIG. 5 is a view illustrating one example of the digital signal delay measuring circuit to which scannable flip-flops are applied.

FIG. 5 is a view showing an example of a digital signal delay measuring circuit to which the scannable flip-flops are applied. In the digital signal delay measuring circuit shown in FIG. 5, the flip-flips in the digital signal delay measuring circuit shown in FIG. 3 are replaced with the scannable flip-flops shown in FIG. 4. In the example of FIG. 5, a P6_DIN signal line equivalent to the P1_DIN signal line shown in FIG. 3 is connected to the GND (grounded). As the signal in the P6_DIN signal line is a signal not used in the operation of the present invention, it may be connected to GND or VCC. In addition, in the example of FIG. 5, the flip-flop P1_FFL shown in FIG. 3 is made of two flip-flips, that is, flip-flip P6_FFL0 and flip-flop P6_FFL1. All the flip-flops shown in FIG. 5 perform reading and wiring of data from the scan line.

Figure 6:
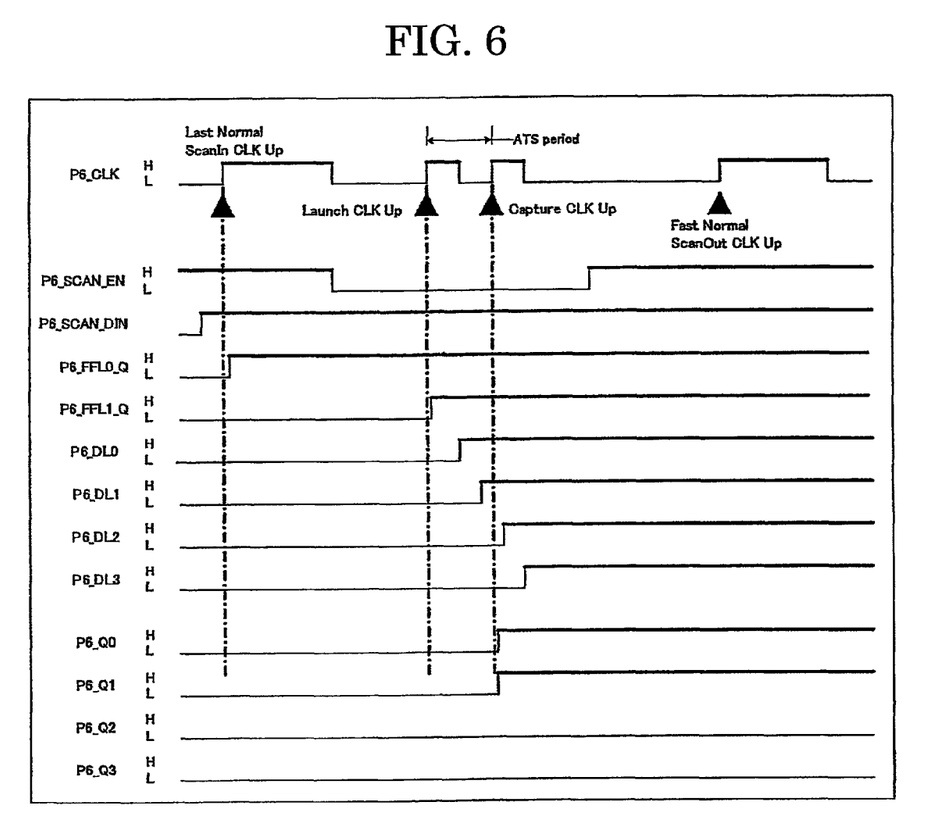
FIG. 6 is a view illustrating an example of a waveform when the digital signal delay measuring circuit shown in FIG. 5 is operated.

FIG. 6 is a view showing a waveform example when the digital signal delay measuring circuit shown in FIG. 5 is operated.

With reference to FIG. 6, the operation example of the digital signal delay measuring circuit shown in FIG. 5 will be described below. Here, all of the flip-flops shown in FIG. 5 are of type of storing (holding) data when the clock signal is changed from the Low level to the High level.

As shown in FIG. 6, a P6_CLK signal is input to a P6_CLK signal line. This P6_CLK signal has both clock functions of a normal-speed scan clock and a real-time scan test clock, as shown in FIG. 6. As the real-time scan test clock, there are two cycle user clocks, "LaunchCLK" and "CaptureCLK", as shown in FIG. 1, having a pulse width actually used in the user circuit (digital circuit) (this width is shorter than that of normal-speed scan clock). These user clocks are generated in the real-time scan test by the clock generating means (not shown).

First, in the example of FIG. 6, when a P6_SCAN_EN signal in a P6_SCAN_EN signal line is set to the High level and a P6_SCAN_DIN signal in a P6_SCAN_DIN signal line is maintained at the Low level, a normal-speed scan clock is added to the P6_CLK signal line. With this scan shift operation, all the flip-flops shown in FIG. 5 are initialized at the Low level. Here, the state (High or Low) of the P6_SCAN_EN signal is different between the time of using the user circuit and the time of scan test. Besides, the P6_SCAN_DIN signal is an output of a preceding-step flip-flop on the scan path.

As illustrated in FIG. 6, the P6_SCAN_DIN signal is set to the High level and this "High" level is stored in the flip-flop P6_FFL0 at the timing of "Last Normal ScanIn CLK Up". Then, the P6_SCAN_EN signal is set to the Low level so that the whole of the circuit operates as a user circuit and the next clock rising "Launch CLK Up" is awaited.

Then, at the "Launch CLK Up" the flip-flop P6_FFL1 stores the "High" state of the P6_FFL0_Q signal that is an output from the flip-flop P6_FFL0. The P6_FFL1_Q signal that is an output signal of the flip-flop P6_FFL1 is sent via the delay element P6_D0 shown in FIG. 5 to the P6_DL0 signal line that is data input of the flip-flop P6_FFL0. Accordingly, the P6_DL0 signal in the P6_DL0 signal line is delayed by a delay time of the delay element P6_D0 as compared with the P6_FFL1_Q signal. Likewise, the output signal of the delay element P6_D0 is sent via the delay element P6_D1 to the P6_DL1 signal line. Accordingly, the P6_DL1 signal is delayed by a delay time of the delay element P6_D1 as compared with the P6_DL0 signal. The P6_DL2, P6_DL3 signals are also delayed by delay times of the respective delay elements P6_D2, P6_D3 in a similar manner.

In the real-time scan test period "ATS period" (which is the real-time scan test period from the occurrence (rise) of the first user clock (LaunchCLK) to the occurrence (rise) of the second user clock (CaptureCLK)), the delay elements P6_D0, P6_D1, P6_D2, P6_D3 are adjusted appropriately. This adjustment reveals that some flip-flops are able to store (hold) the High state of the P6_FFL1_Q output at the timing of "Capture CLK Up" and other flip-flips are unable to do so.

In the example of FIG. 6, as the P6_Q0 signal and the P6_Q1 signal are only at the High level at the timing of "Capture CLK Up", the flip-flops P6_FFC0 and P6_FFC1 shown in FIG. 5 are only able to store the "High" state at the same timing. At the timing of "Capture CLK Up", as the P6_DL2 and P6_DL3 signals remain Low, the flip-flops P6_FFC2 and P6_FFC3 are unable to store the High state. In this example, if the delay time of each flip-flop from the rising time of the P6_FFL1_Q signal is a delay time which is the sum of the delay times of the delay elements P6_D0 and P6_D1, the data is to be sent correctly. However, if the delay time is the sum of delay times of the delay elements P6_D0, P6_D1 and P6_D2, the data is difficult to send correctly. The data stored in each flop-flop becomes detectable by an external device such as an IC tester by changing the P6_SCAN_EN signal from the Low state to the High state and outputting this to the outside by the scan shift operation. Then, it becomes possible to determine the delay time of the digital signal.

Here, description has been made with the example of FIG. 6 in which each flip-flop shown in FIG. 5 is initialized at the Low state before a High signal is sent. However, if the logical values shown in FIG. 6 are reversed to be applied to the P6_SCAN_DIN signal, it becomes possible to measure a delay time of the case where each flip-flop shown in FIG. 5 is initialized at the High state and a Low signal is sent. Generally, the delay time of the digital signal is different between the case where the flip-flop changes from the Low state to the High state and the case where the flip-flop changes from the High state to the Low state. According to the present invention, the delay times of both cases can be measured by the same circuit.

Figure 7:
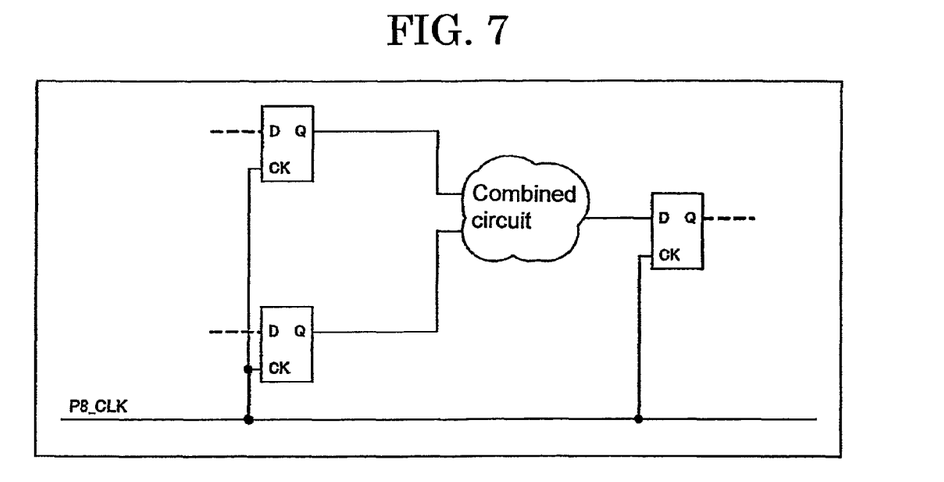
FIG. 7 is a view illustrating an example of a user circuit.
Figure 8:
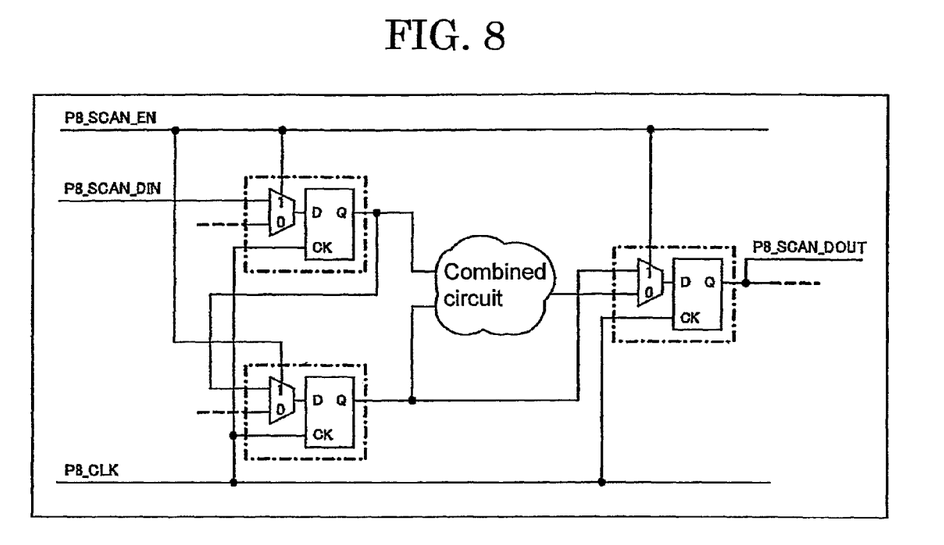
FIG. 8 is a view illustrating another example of the user circuit of FIG. 7 in which the flip-flops of FIG. 7 are replaced with the scannable flip-flops shown in FIG. 4.
Figure 9:
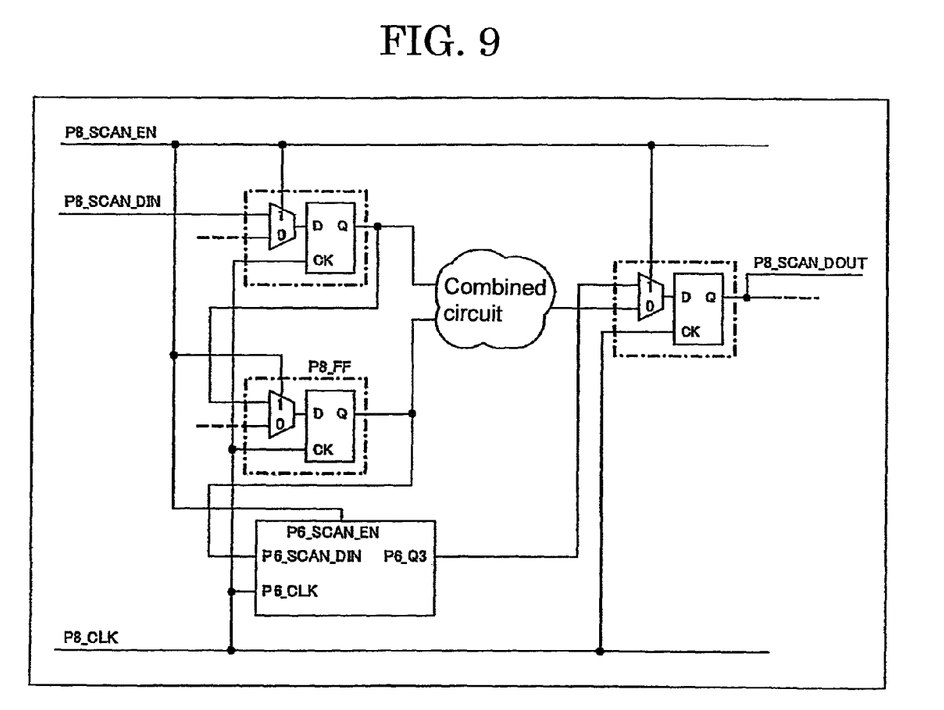
FIG. 9 is a view illustrating the user circuit of FIG. 8 connected to the digital signal delay measuring circuit shown in FIG. 5.

FIGS. 7 to 9 illustrate examples of the user circuit. In FIG. 8, the flip-flop of the user circuit shown in FIG. 7 is replaced with the scannable flip-flop shown in FIG. 4 and a scan path signal is added. In FIG. 9, the digital signal delay measuring circuit shown in FIG. 5 is connected to the user circuit shown in FIG. 8. In the example of FIG. 9, an output (Q) of the flip-flop P8_FF in this figure becomes the P6_SCAN_DIN signal which is the input signal of the flip-flop P6_FFL0 shown in FIG. 5. In addition, as the flip-flops can be connected in any order to the scan path line, as shown in FIG. 9, the circuit shown in FIG. 5 can be inserted to a part of the scan path line shown in FIG. 8. In this way, in the standard embodiment, the circuit of this invention is inserted to a part of an existing scan circuit. Here, as shown in FIG. 9, the circuit of this invention is a circuit independent from the user circuit as shown in FIG. 7 and connected via the scan path line only. In other words, the circuit of this invention does not have any influence on the fundamental operation of the user circuit itself.

Next description will be made, with reference to FIGS. 10 to 12, about a more practical example of the digital signal delay measuring circuit of the present invention.

Figure 10:
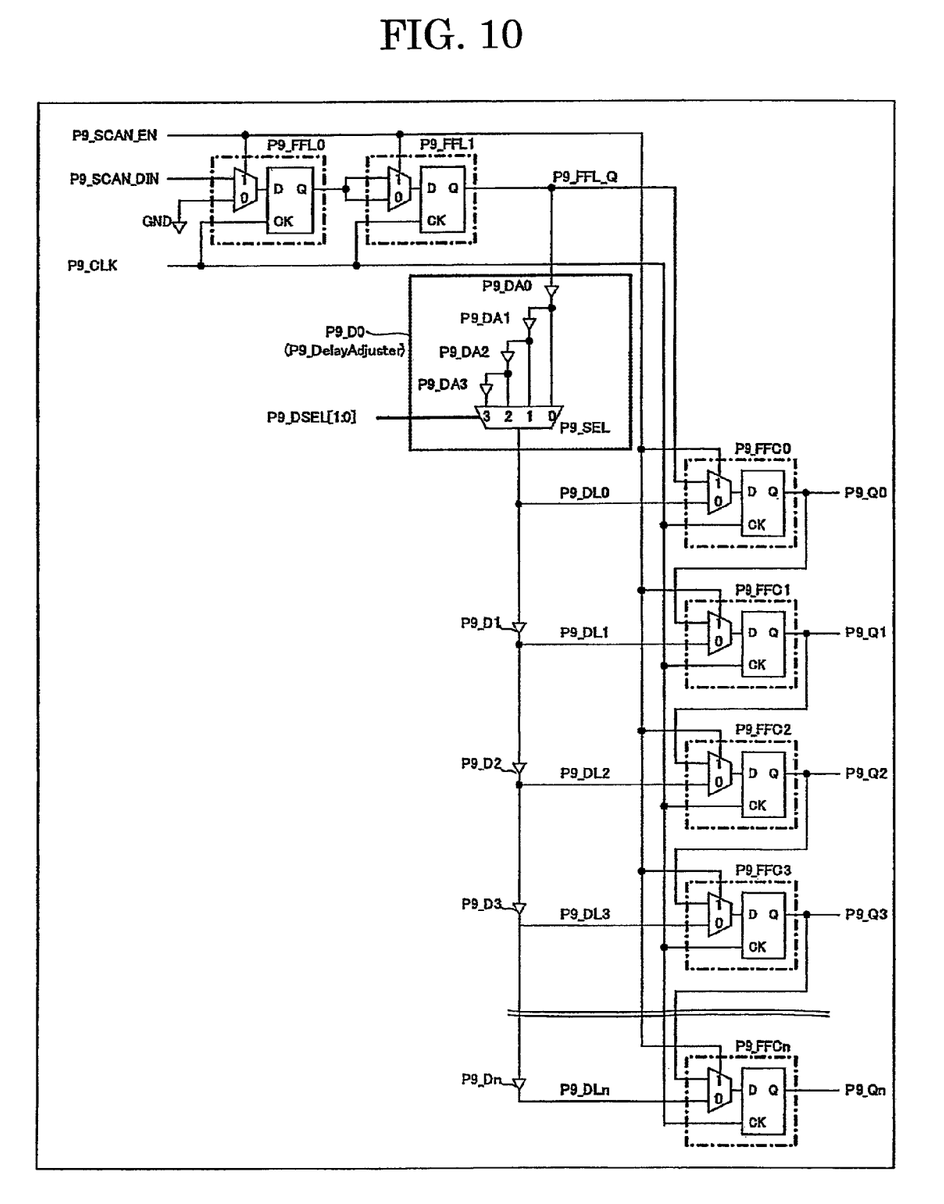
FIG. 10 is a view illustrating a more practical example of the digital signal delay measuring circuit to which the scannable flip-flops are applied.

FIG. 10 is a view of the more practical example of the digital signal delay measuring circuit to which the scannable flip-flop is applied. The digital signal delay measuring circuit shown in FIG. 10 is a circuit in which the delay element P6_D0 in the digital signal delay measuring circuit shown in FIG. 5 is changed into a delay adjusting circuit P9_D0 (P9_DelayAdjuster) as one example of delay adjusting means and the flip-flops and the delay elements are increased in number. In other words, the delay adjusting circuit P9_D0 is inserted in the signal transmission path between the output part of the flip-flop P9_FFL1 and the input part of the flip-flop P9_FFC0.

In FIG. 10, the delay elements P9_D1, P9_D2, . . . , P9_Dn need to be elements of which delay time is shorter as the measuring accuracy of the delay time depends thereon. Generally, the highest-speed element in logical circuit elements is a NOT element. For example, in the case of the 90 mm process LSI, the delay time of the NOT element is around 15 ps. Two such NOT elements are connected in series to form delay elements P9_D1, P9_D2, . . . , P9_Dn. The delay measurement accuracy of the circuit shown in FIG. 10 is 30 ps. Here, also in consideration of any influence of a jitter time of the P9_CLK signal and the like, this delay measurement accuracy has a little margin of error.

In this example, assuming that the user circuit operates at 400 MHz, the period "ATS period" shown in FIG. 6 is 2500 ps. If the period "ATS period" is all measured by the delay elements of 30 ps, there is need to prepare 84 or more delay elements and 84 or more flip-flops in consideration of the equation 2500 ps/30 ps=83.333.

In FIG. 10, 84 flip-flops 9_FFC0, P9_FFC1, P9_FFC2, P9_FFC83 and 84 delay elements P9_D0, P9_D1, P9_D2, P9_D3, . . . P9_D83 need to be prepared. However, if an estimated variation in delay times is around plus or minus 10% of delay time even in consideration of the dynamic IR-Drop, measurement only needs to be made for 500 ps which corresponds to 20% of 2500 ps. When 500 ps is measured, only 17 or more delay elements of 30 ps have to be arranged.

In addition, the delay adjusting circuit P9_D0 shown in FIG. 10 may be used to realize a delay of around 2250 ps. In other words, the delay adjusting circuit P9_D0 delays the delay time measuring signal, before the signal is delayed by each delay element, in such a manner that the state of the delay time measuring signal in each signal line is sequentially changed by each delay element within the predetermined range (for example, plus or minus 10% of the "ATS period" time (for example, 2500 ps) (for example, the range of −250 ps to +250 ps) around the timing of "Capture CLK Up" (input timing of holding command).

Figure 11:
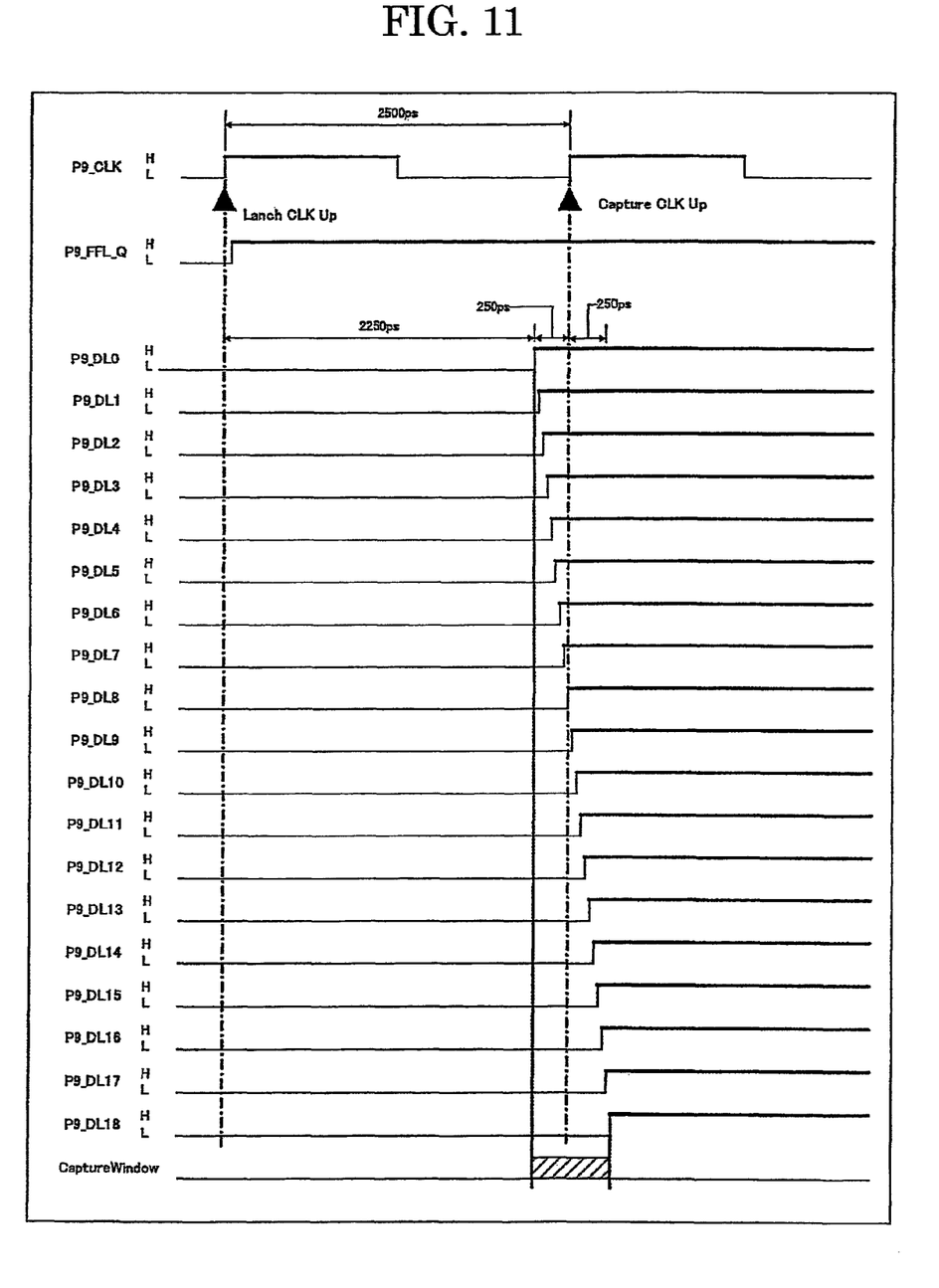
FIG. 11 is a view illustrating an example of a waveform when the digital signal delay measuring circuit shown in FIG. 10 is operated.
Figure 12:
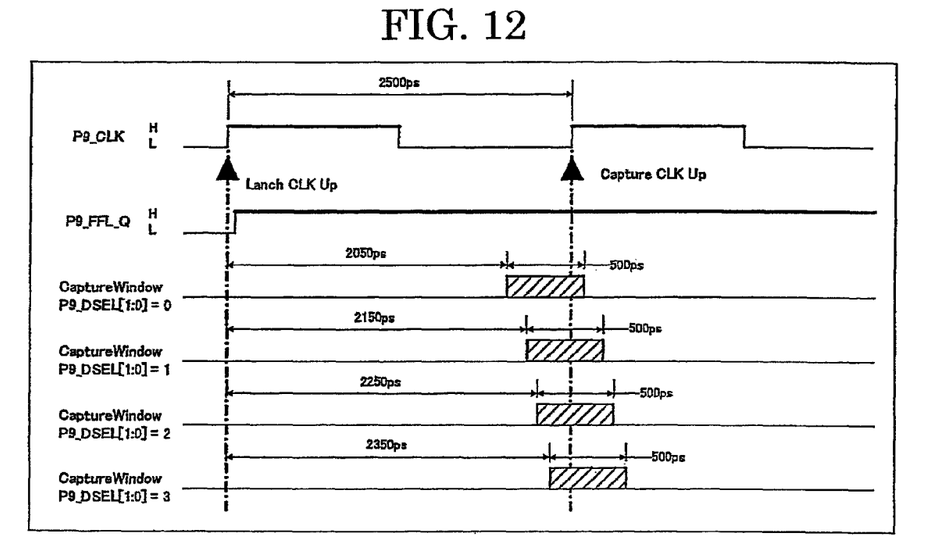
FIG. 12 is a view illustrating an example where Capture Windows are increased in number.

The waveform at this time is shown in FIG. 11. FIG. 11 shows a waveform example when the digital signal delay measuring circuit shown in FIG. 10 is operated. In the example of FIG. 11, 19 delay elements P9_D0, P9_D1, P9_D2, . . . P9_D18 and 19 flip-flops P9_F-FC0, P9_FFC1, P9_FFC2, . . . P9_FFC18 are arranged. These delay elements and flip-flops form an area for measuring a delay time (hatch pattern area), which is called "Capture Window".

In addition, the actual delay time of the element may fluctuate more then the expected plus or minus 10% delay time. In this case, the delay adjusting circuit P9_D0 is effectively structured to be able to adjust the delay time. In other words, the center of the "Capture Window" is shifted left or right with the timing of "Capture CLK Up" as a reference. For example, the P9_DSEL [1:0] signal shown in FIG. 10 is used to change the delay time of the delay adjusting circuits P9_D0. FIG. 12 shows an example of increased "Capture Window". When the P9_DSEL [1:0] signal is "0", the delay time becomes the sum of the delay times of the delay elements "P9_DA0" and "P9_SEL", in which case the delay time is 2050 ps as shown in FIG. 12. In addition, when the P9_DSEL [1:0] signal is "1", the delay time becomes the sum of the delay times of the delay elements "P9_DA0", "P9_DA1" and "P9_SEL", in which case the delay time is 2150 ps as shown in FIG. 12. That is, in this example, the delay adjusting circuit P9_D0 is used to delay the timing when the state of the delay time measuring signal is changed (from Low to High in this example) by a time falling within the range of 82% to 94% of the real-time scan test period (2500 ps in this example). Here, the P9_DSEL [1:0] signal may be supplied from the IC external terminal or controlled by the scannable flip-flop. With the latter structure, all can be controlled by scan signals.

In this way, as the circuit is structured as shown in FIG. 10, it becomes possible to measure the delay time within a broader time range without enlarging the circuit size extensively.

As described up to this point, according to the digital signal delay measuring circuit according to this embodiment, it is possible to measure the delay time of the digital circuit instantaneously, to measure, at low cost, the true delay time with the influence of the dynamic IR-Drop taken into consideration and to study the delay fault in more detail. Besides, this digital signal delay measuring circuit can be used to measure the delay time with no influence on the user circuit as a test target.

Besides, as the circuit having the delay elements and scannable flip-flops is structured using the same elements as the user circuit, it is possible to make a measurement of a possible operation of the user circuit. Hence, it is possible to measure the delay time due to the dynamic IR-Drop that may occur in the user circuit actually thereby to allow more accurate delay fault diagnosis.

Further, as the measuring accuracy of the delay time is determined by the delay elements P6_D0, P6_D1, P6_D2, P6_D3 as shown in FIG. 5, the accuracy can be approximated at its feasible limit of the digital circuit thereby to provide more accurate delay information. With this structure, it is possible, in ranking based on delay time, to present more objective measurement results so that more accurate ranking is achieved. In addition, as the delay time measurement can be carried out simultaneously with the existing delay fault diagnosis, it becomes possible to provide delay information without increase in the time cost for IC manufacture test.

In addition, as shown in FIG. 9, this digital signal delay measuring circuit may be a part of a general scan circuit. In addition, as shown in FIGS. 5 and 10, it can be realized with a small-sized circuit. Therefore, the present invention can be used in an existing scan system and does not need much implementation circuit area. This enables realization of the present invention at extremely low cost.

Figure 13:
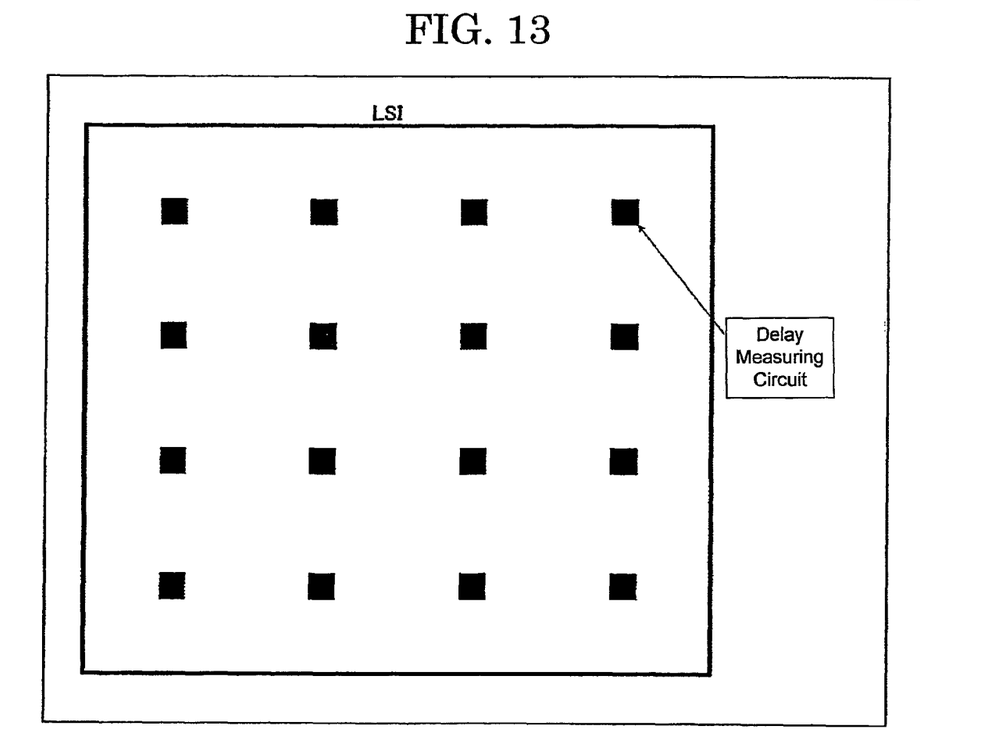
FIG. 13 is a view illustrating an example where a plurality of digital signal delay measuring circuits according to the present embodiment are implemented in the LSI.

Therefore, in view of the cost and circuit area, it is possible to implement a large number of digital signal delay measuring circuits of this invention inside LSI as shown in FIG. 13 (totally 16 circuits, which are shown by black boxes in the figure). As the multiple digital signal delay measuring circuits are implemented inside the LSI, it becomes also possible to measure a difference in delay time by the dynamic IR-Drop depending on the difference in physical position inside the LSI more accurately.

Figure 14:
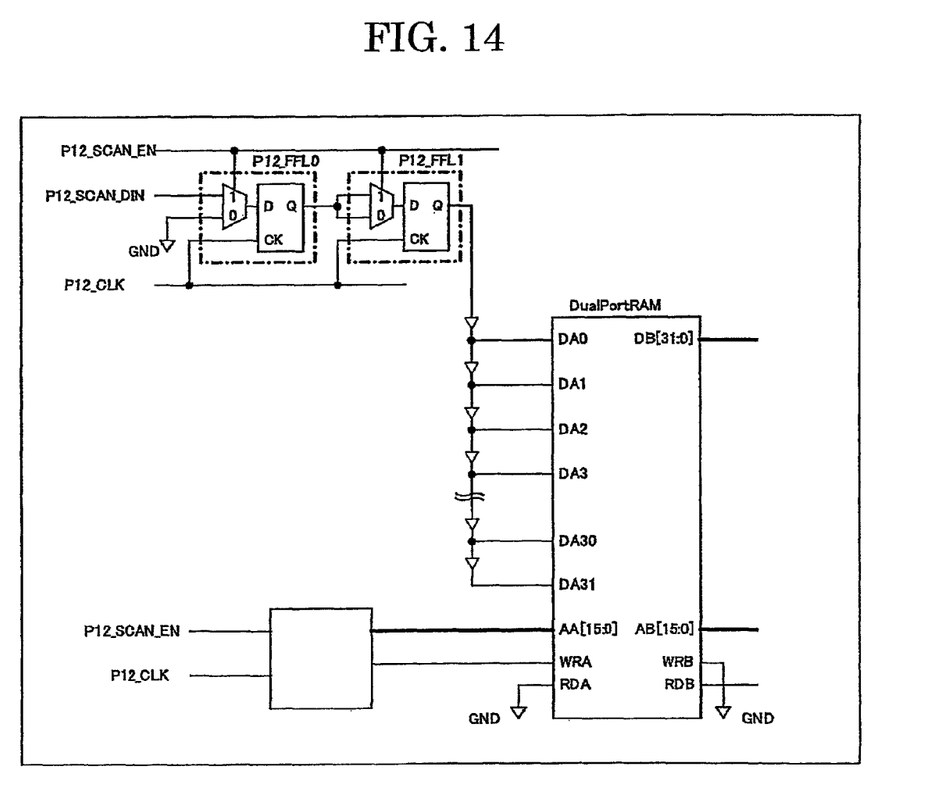
FIG. 14 is a view illustrating a structural example of a digital signal delay measuring circuit using a memory.

Here, the above-mentioned embodiment has been described with the D type flip-flops used as an example of the flip-flop usually used in the scan path circuit. However, in the present invention, the type of flip-flop does not matter. Any type of flip-flop may be used in this structure. Fundamentally, the flip-flop may be a transparent latch. In addition, the structure may be made with a memory element. In the case of memory, if the data line width is 32 bits and the address line width is 16 bits, the data storable at once is 32 bits. Accordingly, the flip-flops P6_FFC0 to P6_FFC3 shown in FIG. 5 can be replaced with memory elements. However, as generally there exists no memory having a scan path structure, there may be a need to initialize the memory and design a transfer circuit of measurement results or the like separately. However, such a circuit structure can be realized as the digital signal delay measuring circuit according to the present invention is a circuit completely independent from the user circuit. In addition, the memory structure can be used to store therein measurement results of plural times by renewing the address per measurement. As one example, FIG. 14 shows a structural example of the digital signal delay measuring circuit having such a memory used therein.

The present invention is not confined to the configuration listed in the foregoing embodiments, but it is easily understood that the person skilled in the art can modify such configurations into various other modes, within the scope of the present invention described in the claims.

The entire disclosure of Japanese Patent Application No. 2008-130151, including the specification, the claims, the drawings, and the abstract, filed on May 16, 2008 is incorporated herein by reference in its entirety.

What is claimed is:

1. A digital signal delay measuring circuit for measuring a delay time of a digital signal of a scan-testable digital circuit inside a device to be tested, comprising:
   outputting means for outputting a delay time measuring signal as a digital signal;
   delay means for delaying a timing when a state of the delay time measuring signal is changed;
   at least two signal holding means, each receiving the delay time measuring signal, and holding the state of the delay time measuring signal at a holding-command input timing; and delay adjusting means for adjusting the delay time of the delay time measuring signal before the delay time measuring signal is delayed by the delay means in such a manner that the state of the delay time measuring signal in each of signal transmission paths is sequentially changed by the delay means within a given range having the holding-command input timing as a reference,
   wherein the digital signal delay measuring circuit is implemented in the device to be tested, and
   wherein the holding-command input timing is identical between the at least two signal holding means, and the timing when the state of the delay time measuring signal input to each of the signal holding means is changed is different depending on the delay means, and
   the delay time is obtained based on a difference in the state of the delay time measuring signal held by each of the signal holding means.

2. The digital signal delay measuring circuit according to claim 1,
   wherein each of the signal holding means receives, as the holding command, a user clock generated by clock generating means for generating the user clock in a real-time scan test, the user clock having a pulse width actually used in the digital circuit.

3. The digital signal delay measuring circuit according to claim 1,
   wherein the delay means is disposed in each of the signal transmission paths between an output unit of the delay time measuring signal of the outputting means and a delay time measuring signal input unit of each of the signal holding means, and
   the numbers of the delay means disposed in the signal transmission paths are different from each other.

4. A delay time measuring method of measuring a delay time of a digital signal of a scan-testable digital circuit inside a device to be tested by using a digital signal delay measuring circuit having:
   outputting means for outputting a delay time measuring signal as a digital signal;
   delay means for delaying a timing when a state of the delay time measuring signal is changed; and
   at least two signal holding means each for receiving the delay time measuring signal and holding the state of the delay time measuring signal at a holding-command input timing,
   the holding-command input timing being adjusted to be identical between the at least two signal holding means, and the timing when the state of the delay time measuring signal input to each of the signal holding means is changed being adjusted to be different depending on the delay means,
   wherein the digital signal delay measuring circuit is implemented in the device to be tested,
   the delay time measuring method comprising the processes of:
   outputting a signal showing the state of the delay time measuring signal held by each of the signal holding means based on the holding-command input timing; and
   measuring the delay time based on a difference in the state shown by the signal output from each of the signal holding means, where the digital signal delay measuring circuit further comprises: delay adjusting means for adjusting the delay time of the delay time measuring signal before the delay time measuring signal is delayed by the delay means in such a manner that the state of the delay time measuring signal in each of the signal transmission paths is sequentially changed by the delay means within a given range having the holding-command input timing as a reference.

* * * * *